United States Patent
Heau et al.

(10) Patent No.: US 9,874,174 B2
(45) Date of Patent: Jan. 23, 2018

(54) INTERNAL COMBUSTION ENGINE LINER

(71) Applicant: H.E.F., Andrezieux Boutheon (FR)

(72) Inventors: Christophe Heau, Saint Etienne (FR); Laurent Bombillon, Andrezieux Boutheon (FR); Philippe Maurin-Perrier, St Marcellin en Forez (FR)

(73) Assignee: H.E.F., Andrezieux Boutheon (FR)

( * ) Notice: Subject to any disclaimer, the term of this patent is extended or adjusted under 35 U.S.C. 154(b) by 254 days.

(21) Appl. No.: 14/395,932

(22) PCT Filed: May 6, 2013

(86) PCT No.: PCT/IB2013/001028
§ 371 (c)(1),
(2) Date: Oct. 21, 2014

(87) PCT Pub. No.: WO2013/164690
PCT Pub. Date: Nov. 7, 2013

(65) Prior Publication Data
US 2016/0369736 A1 Dec. 22, 2016

(30) Foreign Application Priority Data

May 3, 2012 (FR) ..................................... 12 54060

(51) Int. Cl.
| | | |
|---|---|---|
| *F02F 1/00* | (2006.01) | |
| *C23C 16/26* | (2006.01) | |
| *C23C 16/50* | (2006.01) | |

(52) U.S. Cl.
CPC .............. *F02F 1/004* (2013.01); *C23C 16/26* (2013.01); *C23C 16/50* (2013.01); *F02F 2200/00* (2013.01); *F05C 2253/06* (2013.01); *F05C 2253/12* (2013.01)

(58) Field of Classification Search
CPC ....... F02F 1/004; F02F 2200/00; C23C 16/50; C23C 16/26
USPC .................................. 123/193.2; 29/888.061
See application file for complete search history.

(56) References Cited

U.S. PATENT DOCUMENTS

| | | | | |
|---|---|---|---|---|
| 5,916,390 A | * | 6/1999 | Ruckert | B22F 3/115 148/437 |
| 6,228,471 B1 | * | 5/2001 | Neerinck | A61L 27/303 427/402 |
| 6,517,339 B1 | * | 2/2003 | Miya | B29C 45/2632 425/542 |
| 2008/0131604 A1 | * | 6/2008 | Liu | C23C 14/025 427/259 |
| 2009/0026712 A1 | * | 1/2009 | Kawanishi | F16J 9/26 277/443 |
| 2010/0319647 A1 | * | 12/2010 | Ogawa | C22C 21/00 123/193.2 |
| 2011/0239976 A1 | | 10/2011 | Kobayashi | |
| 2011/0254230 A1 | * | 10/2011 | Jarosinski | C22C 27/06 277/444 |
| 2012/0318228 A1 | * | 12/2012 | Aharonov | C23C 16/509 123/193.2 |
| 2013/0328274 A1 | * | 12/2013 | Sugiura | F16J 9/20 277/444 |
| 2014/0137831 A1 | * | 5/2014 | Datta | F02F 1/18 123/193.2 |
| 2014/0178637 A1 | * | 6/2014 | Rajagopalan | C23C 28/044 428/141 |
| 2015/0176518 A1 | * | 6/2015 | Uehara | C23C 16/0254 123/193.2 |
| 2016/0305366 A1 | * | 10/2016 | Da Rocha Mordente | F16J 9/26 |

FOREIGN PATENT DOCUMENTS

| | | |
|---|---|---|
| DE | 20320478 U1 | 8/2004 |
| EP | 0716151 A1 | 6/1996 |
| WO | 2009106981 A1 | 9/2009 |
| WO | 2011051008 A1 | 5/2011 |

OTHER PUBLICATIONS

International Search Report for PCT/IB2013/001028 dated Sep. 27, 2013.

* cited by examiner

*Primary Examiner* — Marguerite McMahon
(74) *Attorney, Agent, or Firm* — Heslin Rothenberg Farley & Mesiti P.C.

(57) ABSTRACT

An inside surface of an internal combustion engine liner is treated to have a surface roughness Ra smaller than 0.06 μm, and then receives a DLC coating. A method of producing the internal combustion engine liner includes: forming the liner from a metal material, polishing an inside surface of the liner to obtain a polished inside surface of roughness Ra smaller than 0.06 μm, and applying the DLC coating to the polished inside surface.

18 Claims, No Drawings

US 9,874,174 B2

INTERNAL COMBUSTION ENGINE LINER

CROSS REFERENCE TO RELATED APPLICATIONS

This application is a national stage filing under section 371 of International Application No. PCT/IB2013/001028, filed on May 6, 2013, and published in French on Nov. 7, 2013 as WO 2013/164690 Al, which claims priority to French Application No. 1254060, filed on May 3, 2012, the entire content of said applications being hereby incorporated herein by reference.

BACKGROUND ART

The present invention relates to an internal combustion engine liner.

More specifically, the present invention relates to a treatment of an internal combustion engine liner or an object of similar geometry, aiming to decrease friction losses. The present invention finds a particularly advantageous application to the automobile field, without this being a limitation.

The use of coatings of DLC (Diamond Like Carbon) type on rings to lower the friction coefficient of most metals is perfectly known by those skilled in the art. Such is, for example, the case for ring, piston, jacket assemblies of an internal combustion engine where the friction may approximately generate from 30 to 40% of the engine losses.

To attempt decreasing the friction coefficient, it has been provided to apply a DLC-type coating to the rings, as for example appears from the teachings of document WO 2011/051008. This solution is however not satisfactory.

It should be reminded, from a kinematic viewpoint, that a ring is submitted to a stronger wear than a liner. Indeed, a point of the ring is in permanent contact with the liner in a return cycle of the piston, while a point of the liner is in contact with the ring for a very short time.

Further, to obtain a satisfactory result, it is necessary to apply a very thick DLC coating, with a thickness generally greater than 10 µm, which is an economical disadvantage and raises significant technical difficulties.

Indeed, the large thickness of the DLC layer generates a significant roughness on the ring, requiring to be corrected after deposition, short of which the wearing of the liner would not be acceptable. It can also be observed that the ring reaches high temperatures which may adversely affect the DLC coating.

As indicated, since the wear is lower in the case of the liner, it has been provided to act at the level of the internal surface of the liner to attempt decreasing the friction.

For this purpose, according to the teachings of the state of the art, the engine liner undergoes a finishing operation comprising creating hollow patterns having the function of keeping lubricant in the considered mechanical contact. Such a finishing operation, known as "honing", is applied either directly in the liner, or in a thick coating applied inside of said liner. This type of solution for example appears from the teachings of patent EP 0716151which relates to a liner having its inside covered with a thick deposit formed by thermal projection, and then submitted to the honing step, which removes up to 10 µm of deposit thickness.

Document WO 2009106981, which refers to a honing step performed after application of the coating, may also be mentioned.

There thus appears from the state of the art that the solutions used to attempt decreasing the friction at the liner level and limiting jamming risks all require a honing step necessary to create raised areas to keep the lubricant in the considered mechanical contact, for example, between the ring and the liner.

Such solutions require a significant quantity of oil on the liner walls. Part of the power is lost in the film shearing.

The invention aims at overcoming these disadvantages in a simple, sure, efficient, and rational way.

The problem that the invention aims at solving is suppressing the honing inside of the liner to minimize the quantity of oil on the liner wall and decrease the forces lost in the oil film shearing.

It is also aimed at decreasing the ring wear to keep an optimal tightness of the segmentation during the engine lifetime.

BRIEF SUMMARY OF THE INVENTION

To solve such a problem, an internal combustion engine liner has been designed and developed, having its inside treated to be totally smooth in order to receive a DLC-type coating.

These features result in that the use of a totally smooth liner, for example, polished, and coated with DLC, significantly decreases losses by friction of the piston ring against the liner and, indirectly, decreases the $CO_2$ emissions of the engine. The use of a low roughness also enables to decrease the ring wear and, accordingly, to maintain a high performance level during the engine lifetime (compression or oil consumption rate). Finally, the use of a DLC coating inside of the liner enables to do away with the final honing step and its resulting disadvantages.

Roughness Ra of the jacket surface before deposition is smaller than 0.06 µm and advantageously smaller than 0.04 µm.

Advantageously, the total thickness of the coating comprising the DLC layer is smaller than 10 µm and preferably smaller than 7 µm and advantageously smaller than or equal to 4 µm.

The engine liner is made of a metal-type material capable of being submitted to a polishing operation to obtain a low roughness. As a non-limiting indication, the liner is made of an aluminum alloy, of steel, of stainless steel . . .

The DLC coating is applied to the inside of the liner by implementing either a specially-adapted method when said liner has a length greater than its diameter, or a more conventional method when the length of said liner is smaller than or of the order of magnitude of its diameter. For example, the DLC coating is applied to the inside of the liner by the vacuum deposition technique comprising, in known fashion, an ion etching step and a step corresponding to the actual deposition.

The ion etching comprises sputtering the surface with massive ions. The surface atoms are ejected, whereby the surface oxide adversely affecting the adherence of a deposit is removed. The etching of the surface oxide brings no modification to the surface state. The deposition comprises cracking a hydrocarbon such as acetylene, methane, . . . which condenses at the surface of the parts to form a DLC coating. To enable the bonding of the DLC, a sub-layer capable of forming a deposition which bonds to the material forming the liner and having the DLC bonding thereto is previously used. This sub-layer may be deposited by PVD technique or by a PACVD technique. The difficulties associated with the treatment of the inside of the liner or equivalent member concern the homogeneity of the plasma and the resulting treatment. The plasma may be created by polarization of the liner or from an auxiliary plasma source placed inside or outside of the liner according to its geometry, that is, to its length with respect to its diameter.

DETAILED DESCRIPTION

The invention is discussed hereafter in further detail by means of the different examples and embodiments, considering the application of a DLC coating inside of a liner entirely polished according to the features of the invention and inside of a liner having undergone a honing operation, according to the state of the art.

In a first embodiment, two steel engine liners, having a 72-mm diameter and a 150-mm length have been coated with DLC. The internal surface of one of the liners is has been, according to the invention, previously polished by a tribofinishing polishing type technique, so that the Ra is smaller than 0.02 µm. The second engine liner has been submitted to a honing operation, such as performed according to the state of the art. The Ra of this second liner is 0.25 µm, and it has a negative RSk. The negative RSk value indicates the presence of the honing grooves.

After cleaning, the liners have been placed in a vacuum enclosure. During the pumping, the vacuum chamber and the liners are conventionally degassed by radiative heating at 200° C. When the vacuum has reached a pressure on the order of $1 \times 10^{-5}$ mbar, argon has been introduced into the vacuum chamber to obtain a 1-Pa pressure and the liners have been taken to a high negative value of −500 V to perform an ion etching, enabling to remove the natural oxide covering the steel to promote the bonding of the coating. After the etching, a deposition of tungsten carbide type has been performed inside of each of the liners by using a cylindrical magnetron cathode having a 30-mm diameter, placed inside of the liner. The target used for this deposition is made of tungsten carbide. The power density applied to the cathode is on the order of 5 W/cm². During the tungsten carbide deposition, acetylene has been introduced at an increasing flow rate so that the structure of the deposit varies from tungsten carbide to an amorphous carbon matrix comprising tungsten. Finally, the DLC-type carbon layer is deposited by taking the part to a −450-V voltage in an acetylene atmosphere at a 0.9-Pa pressure.

These operations result in a DLC-type deposition inside of each liner, which characterizes by a bonding by Rockwell indentation, noted HF1 to HF3. The thickness of the deposit, determined by calotest, indicates that the sub-layer has a 0.7-µm thickness and the DLC has a 2.5-µm thickness.

In a second approved embodiment, two steel engine liners having a 72-mm diameter and a 150-mm length, have been coated with DLC. The internal surface of the first liner has been, according to the invention, previously polished by a buffing-type technique, where disks of fabric impregnated with abrasive paste are rotated inside of the liner, so that the Ra is smaller than 0.04 µm. The second engine liner has been submitted to a honing operation, such as performed according to the state of the art, and its Ra is 0.25 µm.

After cleaning, the liner have been placed in a vacuum enclosure. During the pumping, the vacuum chamber and the liner are conventionally degassed by radiative heating at 200° C. When the vacuum has reached a pressure on the order of $1 \times 10^{-5}$ mbar, argon has been introduced into the vacuum chamber to obtain a 1-Pa pressure and the jackets have been taken to a high negative value of −500 V to perform an ion etching, enabling to remove the natural oxide covering the steel to promote the bonding of the coating. After the etching, a chromium carbide type deposition has been performed inside of each liner by using a cylindrical magnetron cathode having a 30-mm diameter, placed inside of the liner. In this example, the cylindrical magnetron cathode is covered with a chromium carbide target, to which a 5-W/cm² power density is applied. During the chromium carbide deposition, acetylene has been introduced at an increasing flow rate so that the structure of the deposit varies from chromium carbide to an amorphous carbon matrix comprising chromium. Finally, the DLC-type carbon layer is deposited by taking the part to a −450-V voltage in an acetylene atmosphere at a 0.9-Pa pressure.

These operations result in a DLC-type deposition inside of each liner, which characterizes by a bonding by Rockwell indentation, noted HF1 to HF3. The thickness of the deposit, determined by calotest, indicates that the sub-layer has a 0.8-µm thickness and the DLC has a 2.7-µm thickness.

In a third approved embodiment, two stainless steel engine liners having a 86-mm diameter and a 150-mm length, have been coated with DLC. The internal surface of the first liner has been previously polished by an electrolytic polishing technique, so that the Ra is smaller than 0.03 µm. The second engine liner has been submitted to a honing operation, such as performed according to the state of the art, providing a Ra of 0.25 µm.

The rest of the method is identical to the second embodiment.

These operations result in a DLC-type deposition inside of each liner, which characterizes by a bonding by Rockwell indentation, noted HF1 to HF3. The thickness of the deposit, determined by calotest, indicates that the sub-layer has a 0.8-µm thickness and the DLC has a 2.7-µm thickness.

In a fourth approved embodiment of the invention, two steel engine liners, having a 92-mm internal diameter and a 88-mm length, have been coated with DLC. The internal surface of the first liner has been submitted to a fabric polishing providing a roughness smaller than 0.03 p.m. The length of the liner compared to its inner diameter enables to use a more conventional deposition technique, that is, the plasma sources are placed outside of the liner. The second engine liner has been submitted to a honing operation, such as performed according to the state of the art, and its Ra is 0.25 µm.

After these liners have been cleaned, they are positioned on a mechanical assembly enabling the liners to rotate on themselves and inside the machine, according to a planetary motion, enabling the treatment to penetrate from the 2 ends of the liner. After degassing of the vacuum machine by heating at 200° C., the liners are etched in an argon atmosphere at a 0.3-Pa pressure. The etching is performed by taking the jackets to a −150-V voltage with respect to the machine walls. The argon plasma is formed from an ECR microwave system, at a 350-W power. The etching is followed by the deposition of a thin chromium layer having a thickness ranging from 0.1 to 0.2 µm, formed from planar magnetron cathodes equipped with a chromium target to having a 5 W/cm² power density applied thereto. A tungsten carbide layer is then formed by sputtering of a planar magnetron cathode to obtain a 1.5-µm thickness. To achieve this, the second cathode is equipped with a tungsten carbide target having a 5 W/cm² power density applied thereto. Then, acetylene is introduced an increasing flow rate to obtain a layer capable of bonding with DLC. Finally, the DLC is deposited in an acetylene atmosphere by polarizing the liner to −500 V under a 1-Pa pressure, to obtain a 2.2-µm thickness.

These operations result in a DLC-type deposition inside of the liner, which characterizes by a bonding by Rockwell indentation, noted HF1 to HF2. The thickness of the deposit, determined by calotest, indicates that the sub-layer has a 1.7-μm thickness (0.2+1.5) and the DLC has a 2.2-μm thickness.

In a fifth embodiment, two steel engine liners, intended for automobile competition, having a 92-mm diameter and a 80-mm length, have been coated with DLC. The internal surface of one of the liners has been previously polished by a tribofinishing polishing type technique, so that the Ra is smaller than 0.06 μm. The second engine liner has been submitted to a honing operation, such as performed according to the state of the art, and its Ra is 0.25 μm.

After cleaning, the liners have been placed in a vacuum enclosure. During the pumping, the vacuum chamber and the liners are conventionally degassed by radiative heating at 200° C. When the vacuum has reached a pressure on the order of $1 \times 10^{-5}$ mbar, argon has been introduced into the vacuum chamber to obtain a 0.3-Pa pressure, and the liners have been taken to a high negative value of −150 V in a plasma generated by microwave sources positioned on the machine walls to perform an ion etching, enabling to remove the natural oxide covering the steel to promote the bonding of the coating. All along the treatment, the liners displace in the machine according to a planetary motion in order to be exposed to the different plasma sources. After the etching, a deposition of tungsten carbide type has been performed inside of the liner by using a planar magnetron cathode on the walls of the deposition equipment. The planar target is formed of tungsten carbide and a 5-W/cm² power density is applied thereto to perform the deposition. During the tungsten carbide deposition, acetylene has been introduced at an increasing flow rate so that the structure of the deposit varies from tungsten carbide to an amorphous carbon matrix comprising tungsten. Finally, the DLC-type carbon layer is deposited by taking the part to a −380-V voltage in an acetylene atmosphere at a 0.4-Pa pressure. The plasma is generated by the microwave sources positioned on the machine walls.

These operations result in a DLC-type deposition inside of each liner, which characterizes by a bonding by Rockwell indentation, noted HF1 to HF2. The thickness of the deposit, determined by calotest, indicates that the sub-layer has a 1.7-μm thickness and the DLC has a 2.5-μm thickness.

After the different treatments, a strip of a 10-mm width has been cut according to the length of the liner to tribologically characterize the coatings.

For these tests, an A.C. linear tribometer has been used. A steel ball coated with a CrN deposit or with a DLC coating has been used to perform the friction test on the different liner portions. The balls have been conventionally coated with CrN by PVD (magnetron cathode sputtering) except that the thickness of the deposit was 15 μm to be representative of a layer deposited on a ring. Similarly, the coating of the steel balls with DLC comprises a PVD sub-layer of pure Cr having a 1-μm thickness, followed by a PVD layer containing tungsten carbide, which is progressively carbon enriched as it is drawn away from the steel surface, having a 3-μm thickness. Finally, the DLC layer has been formed by PECVD, its thickness is 6 μm, which provides a total coating thickness of 10 μm. A planar polished reference element having an initial Ra of 0.02 μm has been coated with DLC simultaneously to the balls. After the deposition, the roughness on this planar reference element has become 0.08 μm. This roughness increase is induced by the coating thickness.

A 5-N load is applied to the ball, which results in an initial average contact pressure of 540 MPa. The ball has an alternating sliding motion against the liner portions, at an average 35-mm/s speed. The speed varies according to a sinusoidal law obtained by a cam. The travel length is 10 mm. For these tests, a drop of engine oil, of type SAE 5W30, is introduced into the contact. The tests are carried out at a 110° C. temperature. After 15,000 cycles, the friction coefficient is raised, as well as the wearing on the ball and the wearing on the liner portion. The wearing on the ball is quantified by measurement of the diameter of the friction mark, while the wearing on the liner portion is quantified by profilometry across the friction mark. The selected parameters altogether enable to operate at a limiting load, corresponding to the load encountered close to the high neutral point and to the low neutral point. This load is responsible for a great part of the friction loss and of the wear of the parts in contact.

| Test N° | Liner | Liner Ra (μm) | Deposition example N° | Ball | COF | Ball wear | Track wear |
|---|---|---|---|---|---|---|---|
| 1 | honing | 0.11 | | CrN | 0.15 | 105 μm | N.M. |
| 2 | honing | 0.11 | | DLC | 0.10 | 100 μm | 3 μm |
| 3 | Polished + DLC | 0.02 | 1 | CrN | 0.11 | 110 μm | N.M. |
| 4 | Honing + DLC | 0.12 | 1 | CrN | 0.12 | 240 μm | N.M. |
| 5 | Polished + DLC | 0.04 | 2 | CrN | 0.11 | 120 μm | N.M. |
| 6 | Polished + DLC | 0.04 | 2 | DLC | 0.06 | 110 μm | N.M. |
| 7 | Honing + DLC | 0.12 | 2 | DLC | 0.09 | 180 μm | N.M. |
| 8 | Polished + DLC | 0.03 | 3 | CrN | 0.10 | 110 μm | N.M. |
| 9 | Honing + DLC | 0.11 | 3 | CrN | 0.11 | 230 μm | N.M. |
| 10 | Polished + DLC | 0.03 | 4 | CrN | 0.10 | 125 μm | N.M. |
| 11 | Honing + DLC | 0.12 | 4 | CrN | 0.11 | 220 μm | N.M. |
| 12 | Polished + DLC | 0.02 | 5 | CrN | 0.10 | 105 μm | N.M. |
| 13 | Honing + DLC | 0.12 | 5 | CrN | 0.12 | 215 μm | N.M. |

In test n° 1, the behavior at the limiting load of the contact of a ring coated with chromium nitride in front of a liner formed according to a conventional method is reproduced. It can be observed that the friction coefficient is the highest of all tests. The CrN-coated ball does not wear, the friction diameter corresponds to the initial contact area. An examination of the ball also shows a coloring induced by the forming of an anti-wear film on the ball, induced by the oil additives.

In test n° 2, the behavior of a ring coated with DLC is reproduced. The DLC coating enables to decrease the friction coefficient. No wear can be measured on the ball. However, wear can be observed on the liner. This wear is probably induced by the hardness of the deposit on the ball, combined with its roughness.

The test results can then be gathered in 4 large categories:
DLC-coated polished liner / DLC-coated ball (test 6)
In this configuration, the friction coefficient is particularly low (0.06) and the wear of the coated ball is negligible. This example is consistent with the use in an engine.
DLC-coated polished liner/CrN-coated ball (tests 3, 5, 8, 10, and 12)
In this configuration, the friction coefficient approximately ranges between 0.10 and 0.11, and is thus lower than that obtain with no DLC coating. The wear of chromium nitrides is negligible. It can also be observed that the anti-wear oil additives have reacted on the chromium nitride and form an anti-wear film. This series of tests is consistent with the invention.

DLC-coated liner with a honing-type surface state / DLC-coated ball (test 7)

In this configuration, the surface state of the liner is kept as defined in liners used with no DLC coating. Although the antagonists are DLC as in test 6, the friction coefficient is notably higher (0.09). It can also be observed that the DLC deposit on the ball has significantly worn-off (180 µm). This configuration is not consistent with the invention. The roughness of the liner associated with the presence of a DLC coating has resulted in a significant wear of the liner antagonist representing the ring.

DLC-coated liner with a honing-type surface state/CrN-coated ball (tests 4, 9, 11, and 13)

In this configuration, the surface state of the liner is kept as defined in liners used with no DLC coating. The friction coefficients approximately range between 0.11 and 0.12. This value is slightly greater than for tests 3, 5, 8, 10, and 12. However, a relatively high wear, ranging between 215 and 240 µm, can be observed on the CrN-coated balls. This configuration is not consistent with the invention. The roughness of the liner associated with the presence of a DLC coating has resulted in an excessive wear of the liner antagonist.

Finally, these tests clearly show that the sub-layers of the DLC or the method for forming the coating do not significantly influence the wear and friction result.

The advantages can be easily gathered from the description, and it should in particular be underlined and reminded that the replacing of the honing operation inside of the liner with a polishing operation and a DLC coating enables to minimize the ring wear and to decrease friction losses, and thus to decrease $CO_2$ emissions in the case of a combustion engine, especially in the automobile field.

The invention claimed is:

1. A liner for an internal combustion engine wherein an inside surface of said liner has no honing grooves, is treated by material removal ensuring a surface roughness Ra smaller than 0.06 µm, and then receives a DLC coating, all performed outside of the internal combustion engine.

2. The internal combustion engine liner of claim 1, wherein thickness of the coating is smaller than 10 µm.

3. The internal combustion engine liner of claim 1, wherein thickness of the coating is smaller than 7 µm.

4. The internal combustion engines liner of claim 1, wherein thickness of the coating is smaller than or equal to 4 µm.

5. A method of producing a liner for an internal combustion engine, with no honing operation, comprising: forming the liner from a metal material, polishing an inside surface of the liner by material removal to obtain a polished inside surface of roughness Ra smaller than 0.06 µm, and applying a DLC coating to the polished inside surface, wherein the polishing by material removal and the applying of the DLC coating are performed with the liner outside of the internal combustion engine.

6. The method of producing the internal combustion engine liner of claim 5, wherein the DLC coating is applied to the polished inside surface by a vacuum deposition technique comprising an ion etching step and a step corresponding to actual deposition of the coating.

7. The method of producing the internal combustion engine liner of claim 5, wherein value of the roughness Ra of the polished inside surface, before applying said coating, is smaller than 0.04 µm.

8. The internal combustion engine liner of claim 1, wherein value of the surface roughness Ra of the inside surface of the jacket, before receiving said coating, is smaller than 0.04 µm.

9. The method of producing the internal combustion engine liner of claim 5, wherein the applied coating has a thickness smaller than 10 µm.

10. The method of producing the internal combustion engine liner of claim 5, wherein the applied coating has a thickness smaller than 7 µm.

11. The method of producing the internal combustion engine liner of claim 5, wherein the applied coating has a thickness smaller than or equal to 4 µm.

12. A method of producing a liner for an internal combustion engine, with no honing operation, consisting of: forming the liner from a metal material, polishing an inside surface of the liner by material removal to obtain a polished inside surface of roughness Ra smaller than 0.06 µm, and applying a DLC coating to the polished inside surface wherein the polishing by material removal and the applying of the DLC coating are performed with the liner outside of the internal combustion engine.

13. The method of producing the internal combustion engine liner of claim 12, wherein the DLC coating is applied to the polished inside surface by a vacuum deposition technique comprising an ion etching step and a step corresponding to actual deposition of the coating.

14. The method of producing the internal combustion engine liner of claim 13, wherein the vacuum deposition technique further comprises, after the etching step, forming a sub-layer which bonds to the material of the liner and to the material of the coating, followed by the actual deposition of the coating.

15. The method of producing the internal combustion engine liner of claim 14, wherein the sub-layer comprises a tungsten carbide deposition.

16. The method of producing the internal combustion engine liner of claim 15, wherein, during forming of the sub-layer, acetylene is introduced at an increasing flow rate so that structure of the sub-layer varies from tungsten carbide to an amorphous carbon matrix comprising tungsten.

17. The method of producing the internal combustion engine liner of claim 14, wherein the sub-layer comprises a chromium carbide deposition.

18. The method of producing the internal combustion engine liner of claim 17, wherein, during forming of the sub-layer, acetylene is introduced at an increasing flow rate so that structure of the sub-layer varies from chromium carbide to an amorphous carbon matrix comprising chromium.

* * * * *